(12) United States Patent
Priyantha et al.

(10) Patent No.: US 8,674,822 B2
(45) Date of Patent: Mar. 18, 2014

(54) LOW-COST HIGH-FIDELITY ASSET TRACKING IN DATA CENTER FACILITIES

(75) Inventors: Nissanka Arachchige Bodhi Priyantha, Redmond, WA (US); Jie Liu, Medina, WA (US); Dimitrios Lymberopoulos, Bellevue, WA (US); Mari Hern, Manassas, VA (US); Kevin Timmons, Saratoga, CA (US)

(73) Assignee: Microsoft Corporation, Redmond, WA (US)

( * ) Notice: Subject to any disclaimer, the term of this patent is extended or adjusted under 35 U.S.C. 154(b) by 269 days.

(21) Appl. No.: 12/793,696

(22) Filed: Jun. 4, 2010

(65) Prior Publication Data

US 2011/0298607 A1 Dec. 8, 2011

(51) Int. Cl.
*G08B 26/00* (2006.01)

(52) U.S. Cl.
USPC .............. 340/505; 340/568.1; 340/568.4; 340/572.8; 340/572.1

(58) Field of Classification Search
USPC ............. 340/568.1, 568.4, 572.8, 572.1
See application file for complete search history.

(56) References Cited

U.S. PATENT DOCUMENTS

| | | | |
|---|---|---|---|
| 7,436,303 B2 | 10/2008 | Tourrilhes et al. | |
| 8,063,738 B2 * | 11/2011 | Vennelakanti et al. | 340/5.92 |
| 2006/0019679 A1 * | 1/2006 | Rappaport et al. | 455/456.5 |
| 2007/0176782 A1 * | 8/2007 | Mohalik | 340/572.1 |
| 2007/0285241 A1 | 12/2007 | Griebenow et al. | |
| 2008/0198001 A1 | 8/2008 | Sarma et al. | |
| 2009/0189767 A1 | 7/2009 | Primm et al. | |
| 2009/0207022 A1 | 8/2009 | Reckeweg et al. | |
| 2011/0047263 A1 * | 2/2011 | Martins et al. | 709/224 |

OTHER PUBLICATIONS

"HP Creates RFID Technology for Tracking Data Center Assets", Retrieved at << http://www.hp.com/hpinfo/newsroom/press/2006/061017b.html >>, Oct. 17, 2006, pp. 2.

"RFID data center resource management from IBM", Retrieved at << http://www-01.ibm.com/software/solutions/sensors/data-center/rfid-data-center.html >>, Retrieved Date: Apr. 16, 2010, pp. 5.

"Automated Asset Tracking System Case Study", Retrieved at << http://www.omni-id.com/pdfs/Transportation_Industry_Automating_IT_Asset_Tracking_Lowry_OTA.pdf >>, Jul. 2009, pp. 1-7.

\* cited by examiner

*Primary Examiner* — Daryl Pope

(74) *Attorney, Agent, or Firm* — Steve Wight; Carole Boelitz; Micky Minhas (57) ABSTRACT

In one embodiment, an activation unit may render a passive radio frequency identification tag visible to a tracking infrastructure. A radio frequency identification reader may read at close range a passive radio frequency identification tag 304 attached to a server 302. A controller may create an active radio frequency signal for the server 302. A radio antenna may transmit the active radio frequency signal to a position infrastructure node 160.

20 Claims, 12 Drawing Sheets

| SERVER ID 1210 | STATUS 1220 | RACK ID 1230 | SECTION/SLOT ID 1240 |
|---|---|---|---|
| SERVER ID 1210 | STATUS 1220 | RACK ID 1230 | SECTION/SLOT ID 1240 |
| SERVER ID 1210 | STATUS 1220 | RACK ID 1230 | SECTION/SLOT ID 1240 |

| SERVER ID 1210 | STATUS 1220 | ROOM/ZONE ID 1260 | EF 1270 | | | MESH NODE DATA 1280 |
|---|---|---|---|---|---|---|
| | | | TEMP 1272 | HUM 1274 | ACC 1276 | |
| SERVER ID 1210 | STATUS 1220 | ROOM/ZONE ID 1260 | EF 1270 | | | MESH NODE DATA 1280 |
| | | | TEMP 1272 | HUM 1274 | ACC 1276 | |

LOW-COST HIGH-FIDELITY ASSET TRACKING IN DATA CENTER FACILITIES

BACKGROUND

Data centers are hosting facilities for the hardware, such as servers, used to support intranet, internet, cloud computing, and other network-based computing. Modern data centers may have tens of thousands of servers and network equipment spread across warehouse sized buildings. With most data equipment having a life span of 3 to 5 years, the facility may have to constantly install, decommission, and repair equipment, which involves receiving, shipping, and temporarily staging equipment. A server or other piece of network computing equipment may represent a high value asset, resulting from a huge capital and operational investment. Accurately accounting for the status of this equipment may be a major factor in the operation efficiency of many information technologies.

Traditional asset management solutions for data centers, such as barcode schemes and manual surveys, may be time consuming and error prone. A radio frequency identification (RFID) tag system may streamline the asset management problem in many environments. A RFID tag is a tag, usually some type of micro-antenna, applied to a product that may produce a radio frequency signal that may be used to identify that product. An active RFID tag has an internal power source that the tag uses to produce the radio frequency signal. A passive RFID tag does not have an internal power source, instead altering and reflecting a radio frequency signal produced by a reader device.

However, a RFID tag system may be problematic in data centers. Radio frequency signals may have difficulty penetrating metal objects, which constitute a majority of data center equipment. For passive RFID tags, metal objects may weaken the energy of the radio frequency signals reaching the RFID tags and block the signal sent from the IDs. Active RFID tags may still be unreliable in data centers without a very dense deployment of RFID readers, which further increase the cost. Additionally, the battery life for the active RFID tags may be short. As multiple servers become piled upon each other, some servers inside the pile may be completely shielded by other servers.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

In one embodiment, an activation unit, such as a rack mounted server identifier or a snap-on wireless mote, may convert a passive radio frequency identification tag to an active radio frequency signal to render the passive radio frequency identification tag visible to a tracking infrastructure. In one embodiment, a radio frequency identification reader reads at close range a passive radio frequency identification tag attached to a server. A controller creates an active radio frequency signal for the server. A radio antenna may transmit the active radio frequency signal to a position infrastructure node.

DRAWINGS

In order to describe the manner in which the above-recited and other advantages and features can be obtained, a more particular description is set forth and will be rendered by reference to specific embodiments thereof which are illustrated in the appended drawings. Understanding that these drawings depict only typical embodiments and are not therefore to be considered to be limiting of its scope, implementations will be described and explained with additional specificity and detail through the use of the accompanying drawings.

DETAILED DESCRIPTION

Embodiments are discussed in detail below. While specific implementations are discussed, it should be understood that this is done for illustration purposes only. A person skilled in the relevant art will recognize that other components and configurations may be used without parting from the spirit and scope of the subject matter of this disclosure. The implementations may be a machine-implemented method, a tangible machine-readable medium having a set of instructions detailing a method stored thereon for at least one processor, or an asset tracking program for a computing device.

In order to properly monitor data equipment, such as a server, in a data center, each item of hardware may have a passive radio frequency identification (RFID) tag attached to it. An activation unit may read the passive RFID tag and generate an active radio frequency signal. For a server installed in a server rack, the activation unit may be a rack mounted server identifier, where the activation unit is integrated into a server rack. If the server is removed from the server rack or prior to installation, a worker at the data center may affix a snap-on wireless mote near the passive RFID tag to act as an activation unit to create the active radio frequency signal.

In one embodiment, an activation unit, such as a rack mounted server identifier or a snap-on wireless mote, may convert a passive radio frequency identification tag to an active radio frequency signal to render the passive radio frequency identification tag visible to a tracking infrastructure. A RFID reader, such as a rack mounted reader strip or a radio frequency antenna, may read at close range a passive RFID tag attached to a server. A controller, such as a rack controller or a micro-controller, may create an active radio frequency signal representing the server. A radio antenna, such as a radio or a rack mounted antenna, may transmit the active radio frequency signal to a position infrastructure node.

Figure 1:
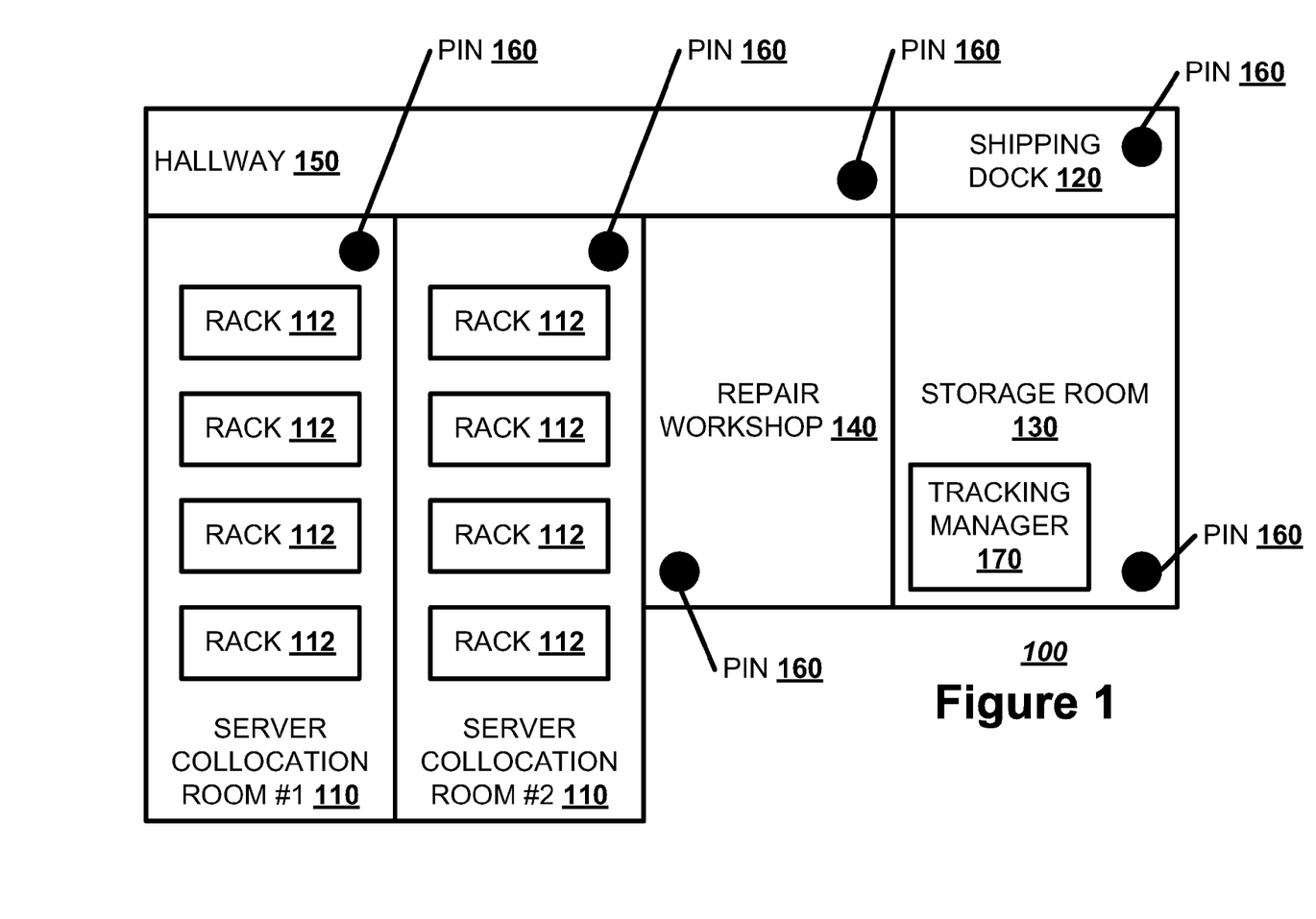
FIG. 1 illustrates, in a floor plan, one embodiment of a data center.

FIG. 1 illustrates, in a floor plan, one embodiment of a data center 100. A data center 100 is any room, building, or other location that is used to store servers, computers, or other data storage and computational devices. A data center may have one or more production server collocation rooms 110. Each production server collocation room 110 may have a set of one or more server racks 112 to store a set of servers or other computer or networking hardware. A server rack 112 may stack the servers vertically, to more efficiently store the servers while allowing for ease of operation and cooling. Most servers, once installed and functioning properly, may stay in the server rack 112 for three to five years before being decommissioned. In addition to the production server collocation rooms 110, the data center 100 may have a shipping dock 120 to receive and ship equipment for the data center 100, one or more storage rooms 130 for temporarily staging servers prior to installment and after decommissioning, and a repair workshop 140 to fix broken servers. A hallway 150 may connect each of the rooms.

A series of position discovery nodes 160, hereinafter referred to as a position infrastructure node (PIN) 160 may be distributed in strategic locations, called zones, throughout the data center 100. The PINs 160 may be radio frequency signal readers, radio frequency transmitters, ultrasound transmitters, and other position detection devices. The data center 100 may be divided into multiple location zones, with a PIN 160 present in each zone. Multiple PINs 160 may be installed at strategic locations to form a mobile asset tracking infrastructure. Examples of these zones may include hallways 150, storage room 130, repair workshop 140, and shipping dock 120. Multiple PINs 160 may be deployed in the same zone to improve asset tracking reliability. The tracking infrastructure may be a simple computerized network receiving input from the PINs 160. The multiple PINs 160 may connect to a tracking infrastructure manager 170 controlling an asset management database through a wireless or wired network. The tracking infrastructure manager 170 may be present in any room in the data center 100 or may be maintained off-site. Since signal propagation from PINs 160 to mobile assets have short range, a PIN 160 that communicates with one or more motes may know that the motes are within the zone.

The PIN 160 may read an active radio frequency signal transmitted for each server at the data center 100. By collecting and organizing the various active radio frequency signals, a tracking infrastructure at the data center may accurately locate where each server is in the data center, to varying degrees of granularity.

Figure 2:
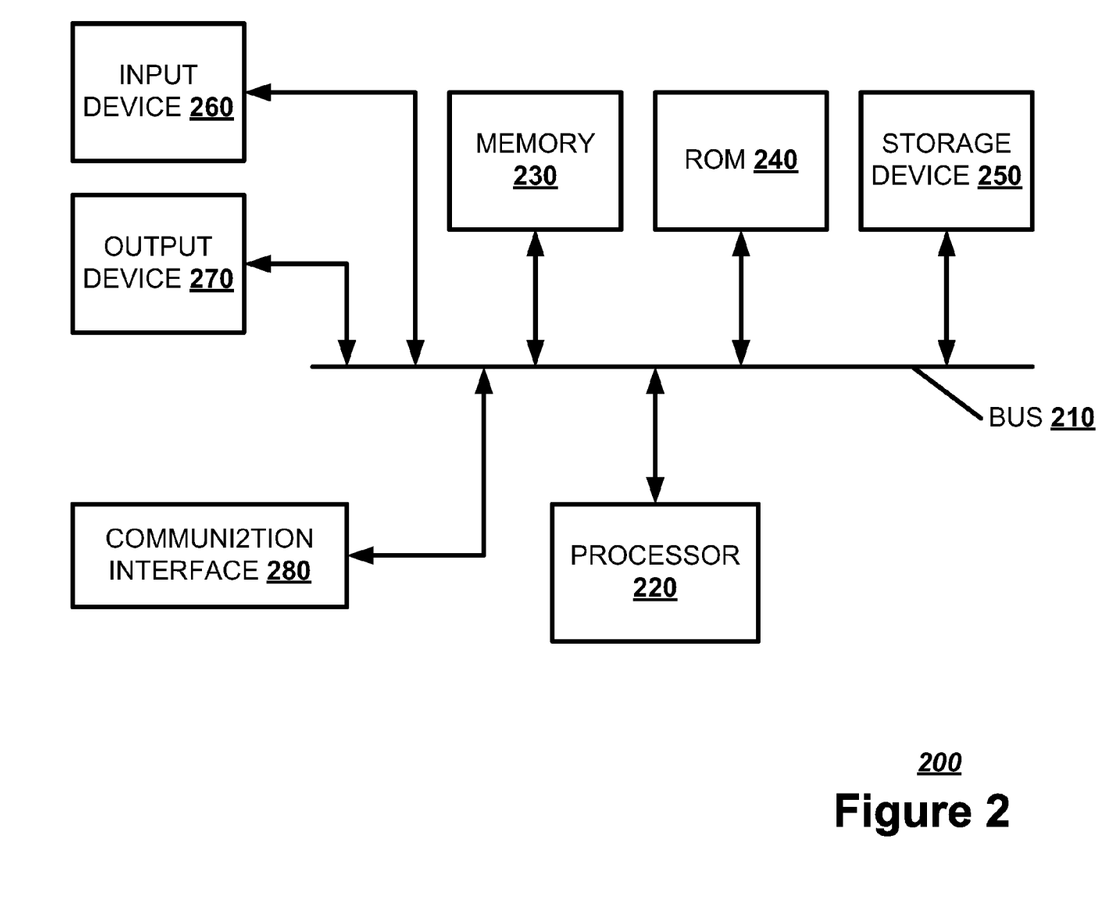
FIG. 2 illustrates, in a block diagram, one embodiment of a computing device.

FIG. 2 illustrates a block diagram of an exemplary computing device 200 which may act as a tracking infrastructure manager 170. The computing device 200 may include a bus 210, a processor 220, a memory 230, a read only memory (ROM) 240, a storage device 250, an input device 260, an output device 270, and a communication interface 280. The bus 210 may permit communication among the components of the computing device 200.

The processor 220 may include at least one conventional processor or microprocessor that interprets and executes a set of instructions. The memory 230 may be a random access memory (RAM) or another type of dynamic storage device that stores information and instructions for execution by the processor 220. The memory 230 may also store temporary variables or other intermediate information used during execution of instructions by the processor 220. The ROM 240 may include a conventional ROM device or another type of static storage device that stores static information and instructions for the processor 220. The storage device 250 may include any type of tangible machine-readable medium, such as, for example, magnetic or optical recording media and its corresponding drive. The storage device 250 may store a set of instructions detailing a method that when executed by one or more processors cause the one or more processors to perform the method. The storage device 250 may also be a database or a database interface for storing the tracking infrastructure data, such as the asset management database.

The input device 260 may include one or more conventional mechanisms that permit a user to input information to the computing device 200, such as a keyboard, a mouse, a voice recognition device, a microphone, a headset, etc. The output device 270 may include one or more conventional mechanisms that output information to the user, including a display, a printer, one or more speakers, a headset, or a medium, such as a memory, or a magnetic or optical disk and a corresponding disk drive. The communication interface 280 may include any transceiver-like mechanism that enables processing device 200 to communicate with other devices or networks. The communication interface 280 may include a network interface or an interface for the network of PINs 160. The interface may be a wireless, wired, or optical interface. In one embodiment, the interface may include a universal serial bus (USB) interface, a Bluetooth® interface, or other such interface that may be used to attach peripheral devices or pair other communication devices.

The computing device 200 may perform such functions in response to processor 220 executing sequences of instructions contained in a computer-readable medium, such as, for example, the memory 230, a magnetic disk, or an optical disk. Such instructions may be read into the memory 230 from another computer-readable medium, such as the storage device 250, or from a separate device via the communication interface 280.

Figures 3A, 3B, 3C:
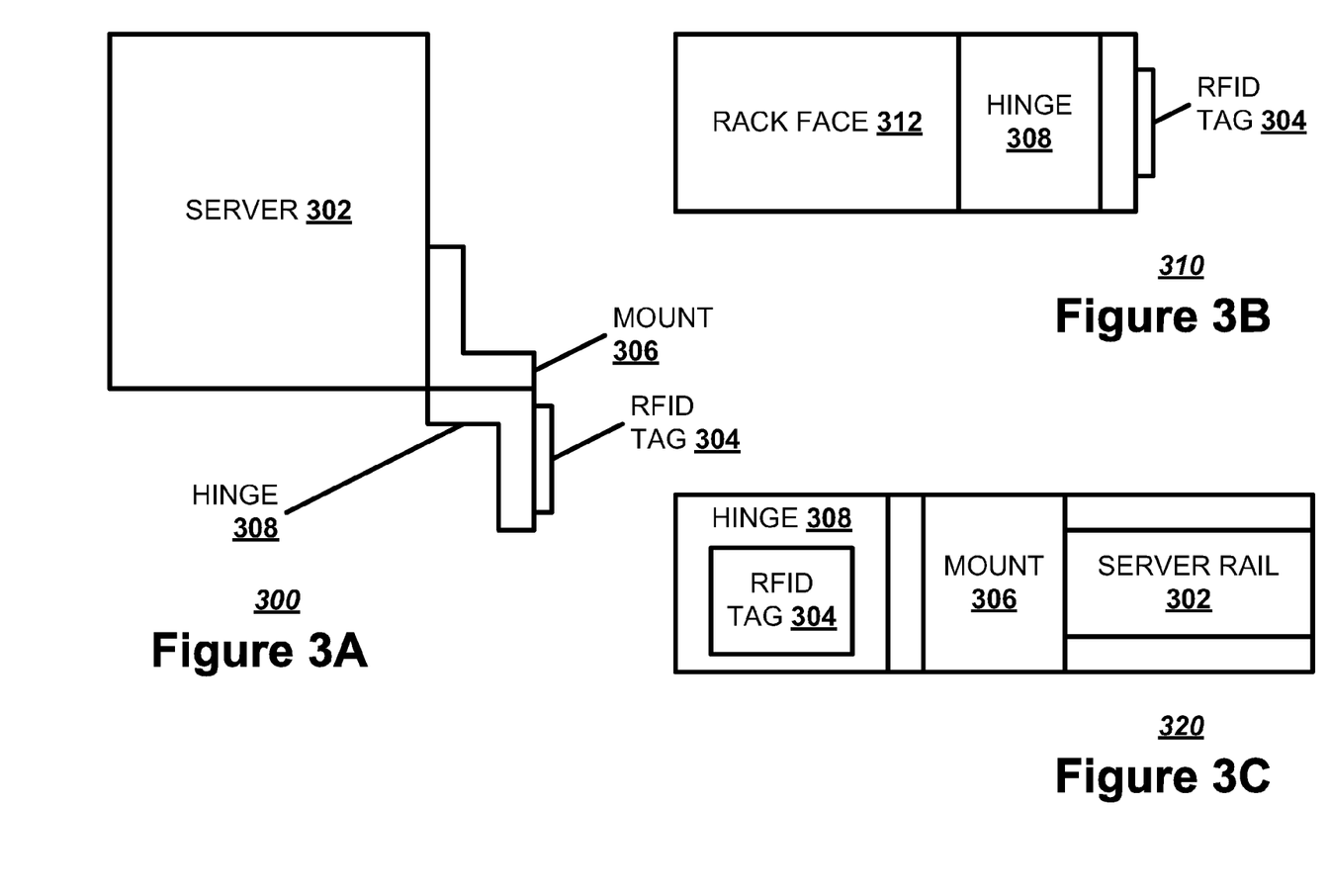
FIGS. 3a-c illustrate, in block diagrams, one embodiment of a server with a passive radio frequency identification tag.

The tracking infrastructure may be used to track a server in the data center 100. A server may be affixed with a passive RFID tag to provide a server identification (ID) to the tracking infrastructure. FIG. 3a illustrates a top view 300 of one embodiment of a server 302 with a passive RFID tag 304. The passive RFID tag 304 may be a high frequency RFID tag 304. The high frequency passive RFID tag 304 may be a relatively inexpensive RFID tag 304, when compared to other RFID tags, with a short communication distance. The passive RFID tag 304 may be affixed to a "L"-shaped mount 306 on the server 302 via a spring loaded hinge 308. The spring loaded hinge 308 may be an "L"-shaped hinge with a 1 cm wing affixed to the mount and a 3 cm wing supporting the passive RFID tag 304. FIG. 3b illustrates a front view 310 of the server 302. The mount 306 and the spring loaded hinge 308 may be near the rack face 312 of the server 302. As the server 302 is installed into the rack 112, the rack face 312 of the server 302 is the side of the server 302 closest to the rack door. FIG. 3c illustrates a side view 320 of the server 302. The server 302 may have a server rail 322 to support the server 302 into a slot of the rack 112. The passive RFID tag 304, spring loaded hinge 308, and mount 306 may be situated towards the rack face 312 of the server 302 and clear of the server rail 322.

Figure 4:
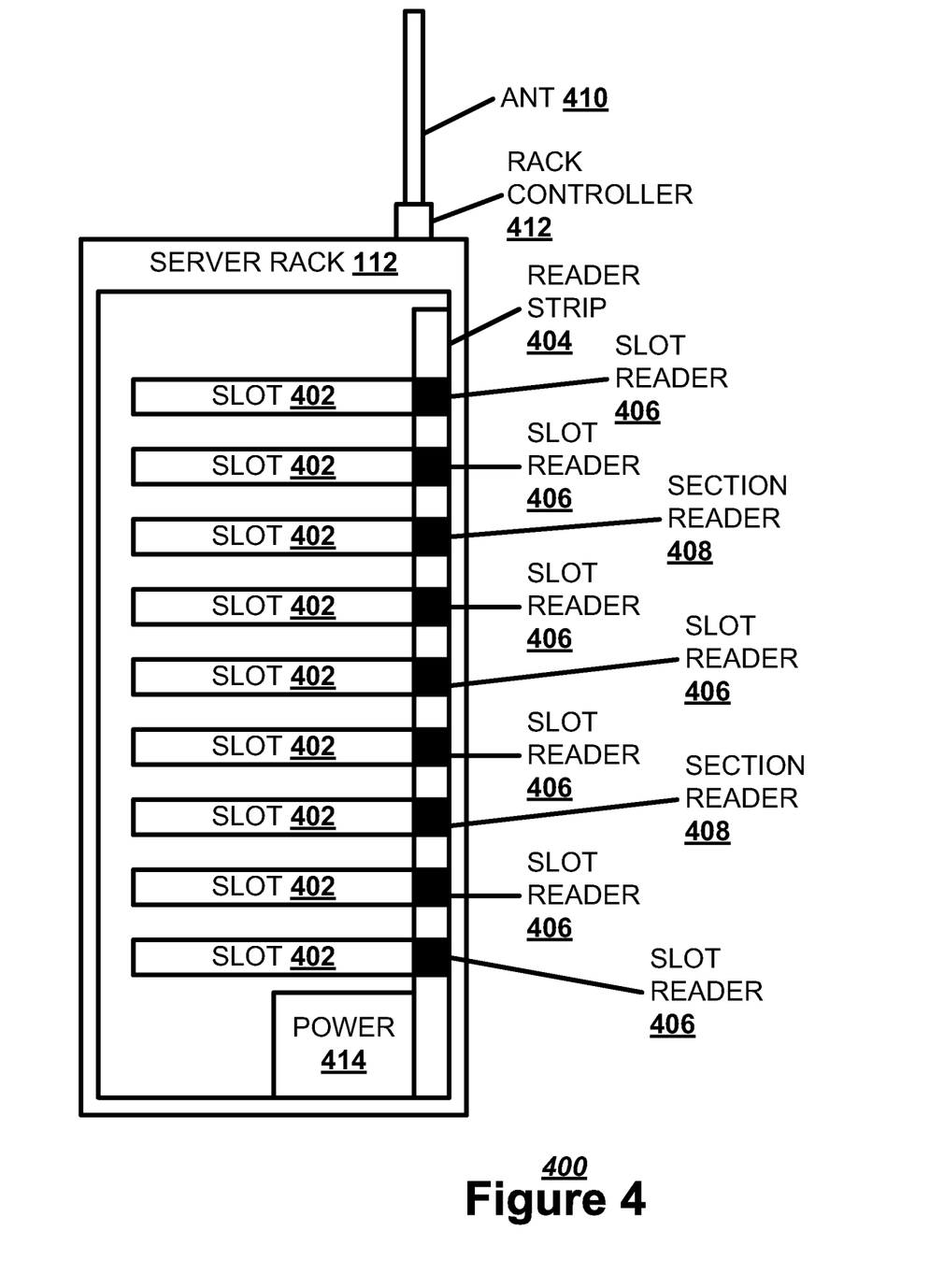
FIG. 4 illustrates, in a block diagram, one embodiment of a server rack with a rack mounted server identifier.

FIG. 4 illustrates, in a block diagram, one embodiment of a server rack 112 with a rack mounted server identifier 400. A server rack 112 may have a number of slots 402 for the insertion of the server 302 into the server rack 112. A rack mounted reader strip 404 may be attached to the face of the server rack 112 along one side, so that the rack mounted reader strip 404 may be close to a passive RFID tag 304 of a server 302 properly inserted into a rack slot 402. A rack mounted reader strip 404 is strip that reads multiple passive RFID tags 304 at once. The rack mounted reader strip 404 may be a series of RFID readers. The rack mounted reader strip 404 may have a low power RFID reader at each rack slot 402, referred to as a slot RFID reader 406, so that a properly inserted server 302 may have its passive RFID tag 304 read. The slot RFID reader 406 may identify the rack slot 402 holding the server. Alternatively, a more powerful reader, referred to as a sectional RFID reader 408, may be spaced throughout the rack mounted reader strip 404 so that a rack section of the server rack 112 may be identified rather than a specific rack slot 402. Further, the rack mounted reader strip 404 may have a single RFID reader mounted on a track system. The track system may allow the single RFID reader to be moved into position to read a passive RFID tag 304 in each rack slot 402.

The rack mounted server identifier 400 may take the server ID read from the passive RFID tag 304 by the rack mounted reader strip 404 and create an active radio frequency signal. The rack mounted server identifier 400 may transmit the active radio frequency signal to the PIN 160 via a rack mounted antenna (ANT) 410 or via a wired connection. The rack mounted server identifier 400 may use a rack controller 412 to append a slot ID, identifying the rack slot 402 holding the server, or a section ID, identifying an area of the server rack 112, to the server ID. The rack mounted server identifier 400 may have a power unit 414 to power the rack mounted reader strip 404, the rack mounted ANT 410, and the rack controller 412.

Figure 5A:
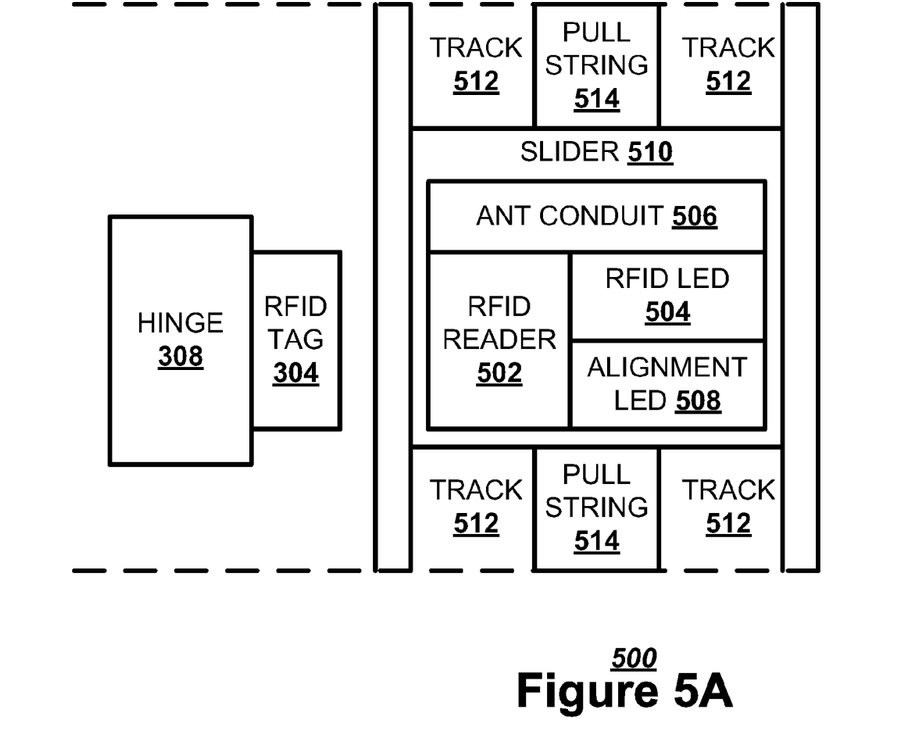
FIGS. 5a-b illustrate, in block diagrams, two embodiments of components of the rack mounted server identifier.

FIG. 5a illustrates, in a block diagram, one embodiments of a rack reader 500 of the rack mounted reader strip 404. The rack reader 500 may be a slot RFID reader 406, a sectional RFID reader 408, or a track system RFID reader. The rack reader 500 may have a low power, high frequency RFID reader 502 to read at close range the passive RFID tag 304. The RFID reader 502 may be associated with a RFID light emitting diode (LED) 504 that may indicate whether the passive RFID tag 304 is being read properly in the rack slot 402. The signal read from RFID tag 304 may be sent via an ANT conduit 506 to the rack mounted ANT 410.

If the server 302 is not properly aligned in the rack slot 402, the RFID reader 502 may fail to read the RFID tag 304. In that instance, the RFID reader 502 may still detect a metal object and register the presence of a server 302, even if the rack reader 500 is unable to read the RFID tag 304 and identify the server 302. Thus, the RFID reader 502 may both detect the presence of a server and identify the server when the server is properly aligned. The RFID reader 502 may be associated with an alignment LED 508 that may indicate whether a misaligned server is present. Additionally, the rack reader 500 may send a misalignment signal to the rack mounted ANT 410 via the ANT conduit 506.

For a rack reader 500 used in a track system, the RFID reader 502 may be placed in a slider 510 that moves along a track 512. The slider 510 may have a pull string 514 attached to either end. The pull string 514 may be attached to the door of the server rack 112. As the door to the server rack 112 is opened, the pull string 514 may lift the slider 510 to the top of the server rack 112. When the door is closed, gravity may lower the slider 510 to the bottom of the server rack 112, allowing the RFID reader 502 to take a reading at each rack slot 402. Alternately, the pull string 514 may be attached to a motor, allowing the slider 510 to be moved automatically.

Figure 5B:
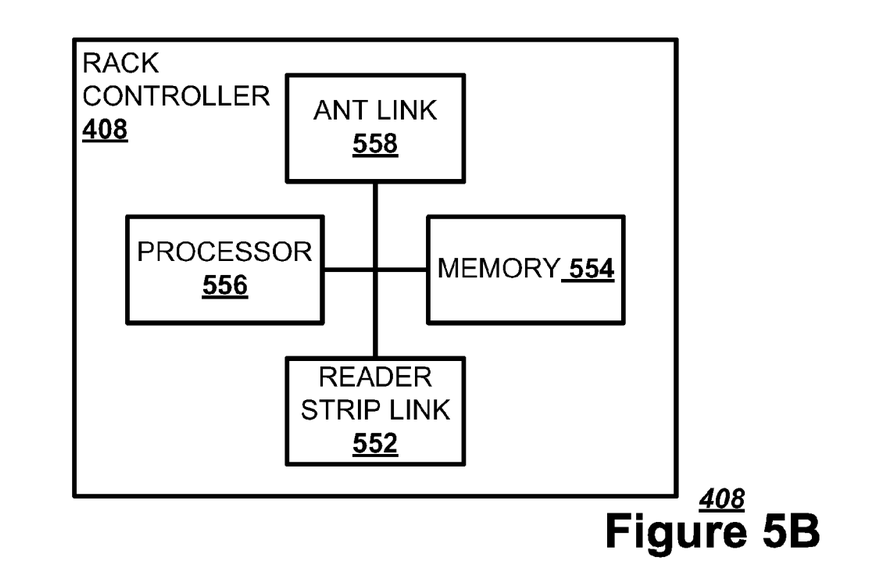

FIG. 5b, illustrates, in a block diagram, one embodiment of a rack controller 412. The rack controller 412 is a small computing device that performs the processing functions for the rack mounted server identifier 400. The rack controller 412 may receive a RFID signal from a rack reader 500 via a reader strip link 552. The rack controller 412 may have an assignment protocol stored in a memory 554. The rack controller 412 may have a processor 556 to append a slot ID or a section ID to the RFID signal according to the assignment protocol. The rack controller 412 may then send the appended radio frequency signal to the rack mounted ANT 410 via an ANT link 558.

Figure 6:
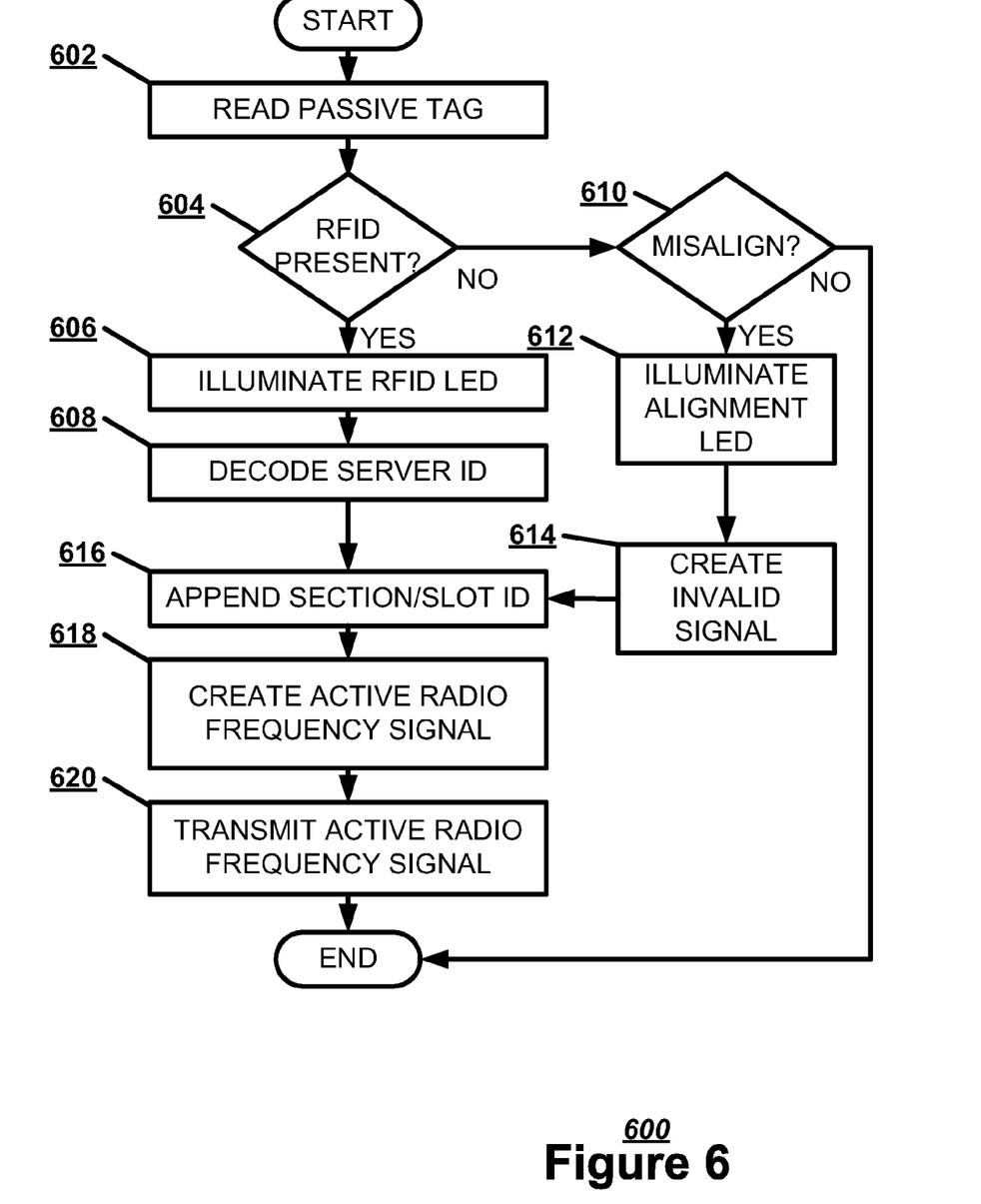
FIG. 6 illustrates, in a flowchart, one embodiment of a method of identifying a server with a rack mounted server identifier.

FIG. 6 illustrates, in a flowchart, one embodiment of a method 600 of identifying a server 302 with a rack mounted server identifier 400. The RFID reader 502 may read at close range a passive RFID tag 304 attached to the server 302 (Block 602). If the passive RFID tag 304 is present (Block 604), the rack mounted server identifier 400 illuminates the RFID LED 504 indicating the passive RFID tag 304 is being read properly in the rack slot 402 (Block 606). The rack controller 412 may decode the server ID captured by the RFID reader 502 (Block 608). If the passive RFID tag 304 is not present (Block 604), the RFID reader 502 may determine if metal, and thus a misaligned server, is present. If the RFID reader 502 does not detect a misaligned server (Block 610), the rack slot 402 may be empty. If the RFID reader 502 detects a misaligned server (Block 610), the rack mounted server identifier 400 illuminates the alignment LED 508 (Block 612). The rack controller 412 may create a signal indicating an invalid reading identifying a rack slot 402 holding a misaligned server (Block 614) The rack controller 412 may append a rack section or a slot ID to the RFID signal, if read, or the invalid signal, if a misaligned server is detected (Block 616). The rack controller 412 may create an active radio frequency signal to represent the server 302 (Block 618). The ANT 410 may then transmit the active radio frequency signal to a PIN 160 (Block 620).

Figure 7A:
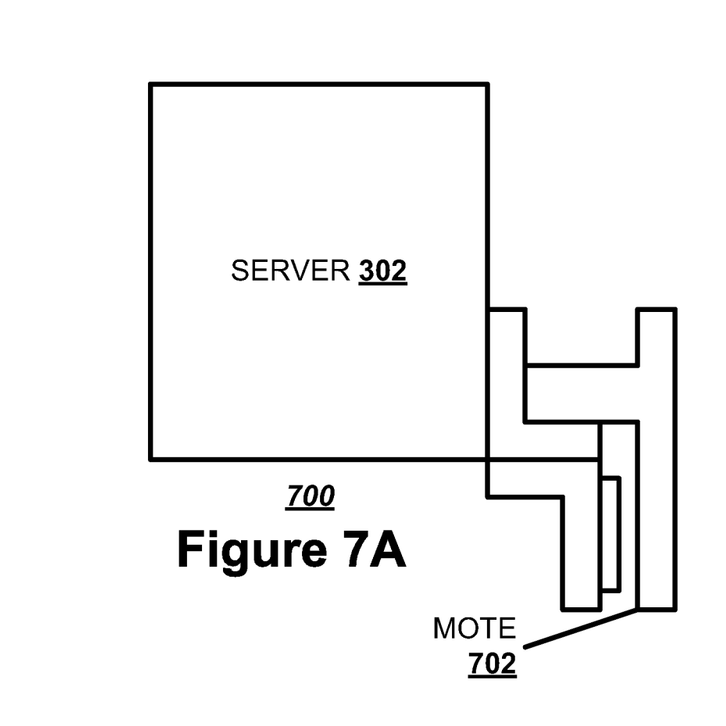
FIGS. 7a-c illustrate, in block diagrams, one embodiment of a mobile server detection system.
Figure 7B:
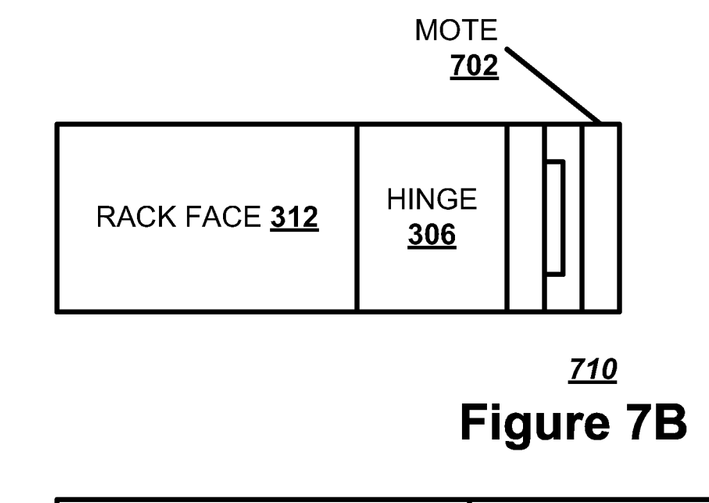
Figure 7C:
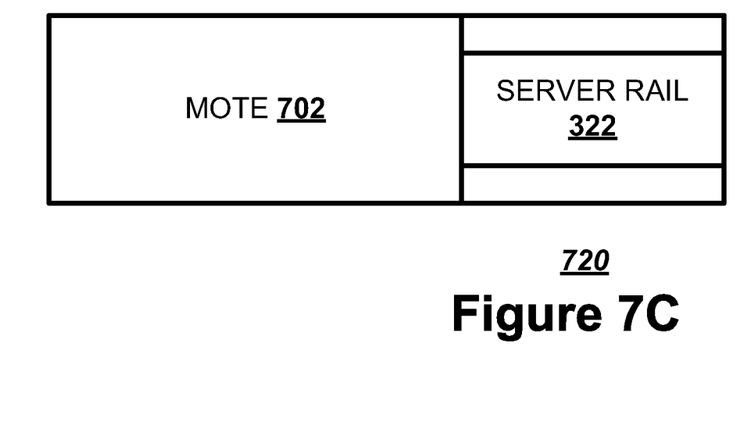

If the server 302 is dismounted from a server rack 112, a worker at the data center 100 may attach a snap-on wireless mote to create a mobile server detection system. FIG. 7a illustrates a top view 700, FIG. 7b illustrates a front view 710, and FIG. 7c illustrates a side view 720 of one embodiment of a mobile server detection system. A snap-on wireless mote 702 may be attached to either the spring loaded hinge 306 or the mount 308 to convert the RFID into an active, mesh networking capable tag.

Figure 8:
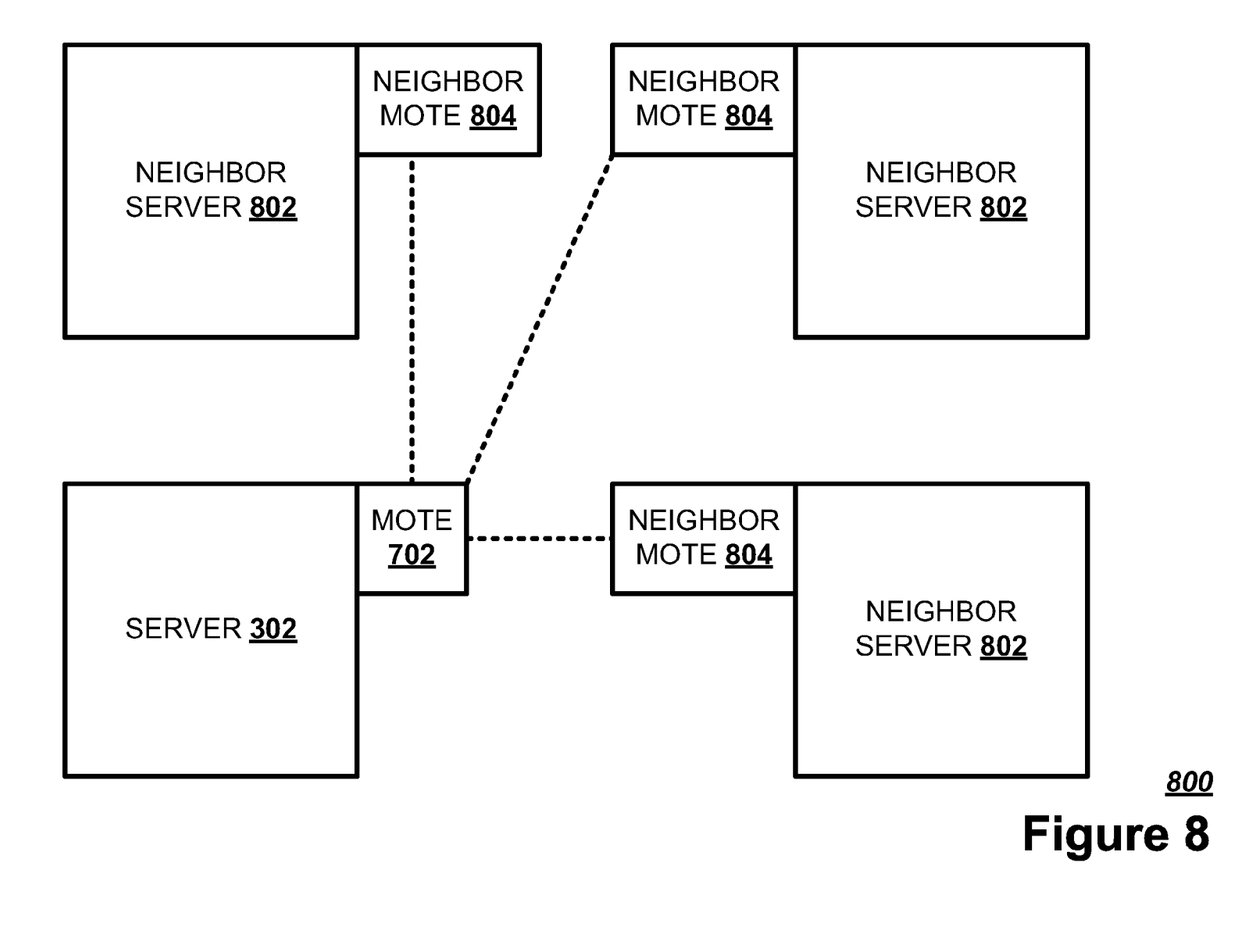
FIG. 8 illustrates, in a block diagram, one embodiment of a mesh node network.

FIG. 8 illustrates, in a block diagram, one embodiment of a mesh node network 800. The snap-on wireless mote 702 may execute a neighbor discovery to find any neighbor servers 802 with a neighbor snap-on wireless mote 804. The snap-on wireless mote 702 may also query the neighbor snap-on wireless mote 804 for their neighbors. The snap-on wireless mote 702 may use this information to build a mesh network 800 over multiple communication hops. The mesh network 800 is a series of inquiries to determine all the snap-on wireless motes 702 in an area by querying all the neighbor snap-on wireless motes 804 in an area, thus discovering all the server IDs in a pile of servers 302.

Figure 9:
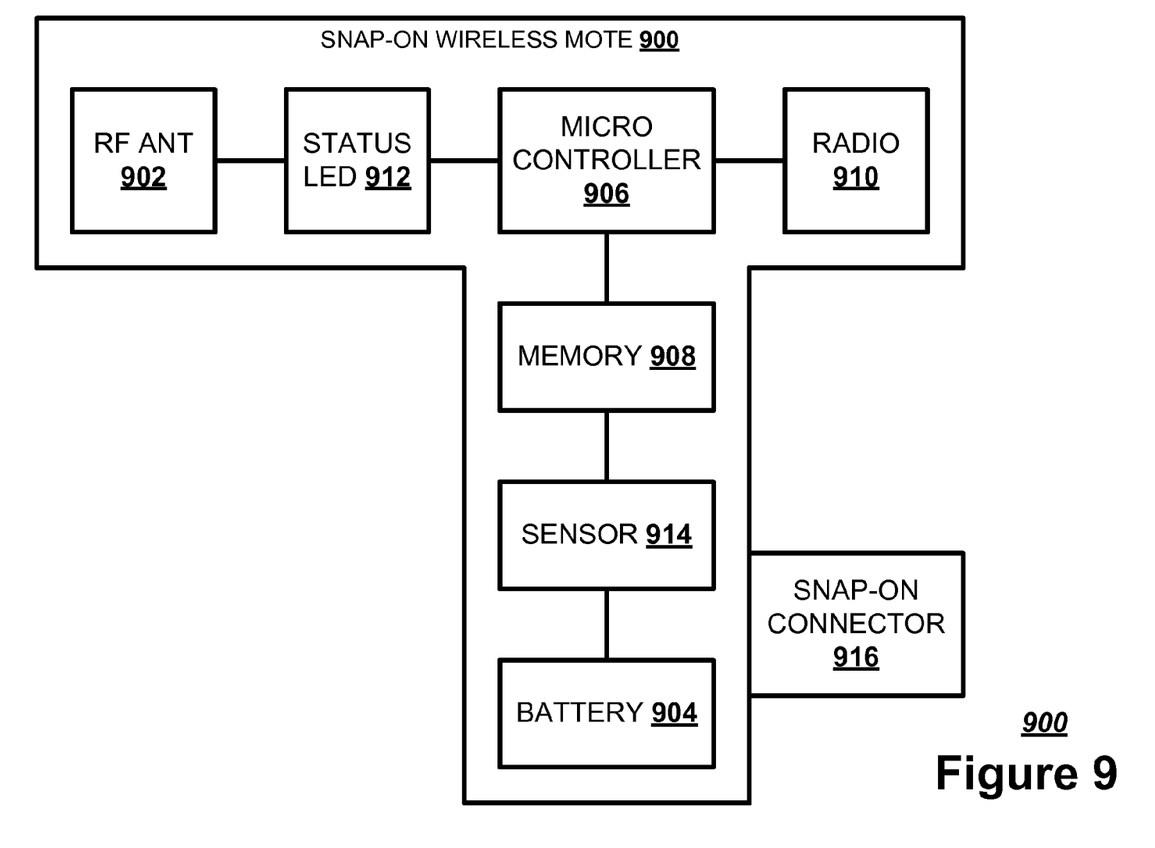
FIG. 9 illustrates, in block diagrams, one embodiment of a snap-on wireless mote.

FIG. 9 illustrates, in block diagrams, one embodiment of a snap-on wireless mote 900. The snap-on wireless mote 900 may have a radio frequency (RF) ANT 902 placed at close range to the passive RFID tag 304. With a very small amount of power, the RF ANT 902 may read the server ID stored in the passive RFID tag 304. The snap-on wireless mote 900 may have a battery 904 to store energy to power the snap-on wireless mote 900. The snap-on wireless mote 900 may have a low-power microcontroller 906. The microcontroller 906 may run the neighbor discovery and execute one or more mesh network protocols stored on a memory 908. The snap-on wireless mote 900 may have a radio 910 to communicate with neighbor snap-on wireless motes 804. The radio 910 may transmit the active radio frequency signal to the PINS 160 of the tracking infrastructure. The radio 910 may be integrated into the microcontroller 906. The snap-on wireless mote 900 may have a status LED 912 that indicates the status of the snap-on wireless mote 900. The status LED 912 may indicate detection of a passive RFID tag 304 or communication with the infrastructure. The snap-on wireless mote 900 may have a sensor 914 to detect environmental factors (EF), such as temperature, humidity, or acceleration data. The acceleration data may be used by an administrator to determine if a server has been dropped or has fallen. The snap-on wireless mote 900 may have a snap-on connector 916 to attach to a server 302.

Figure 10:
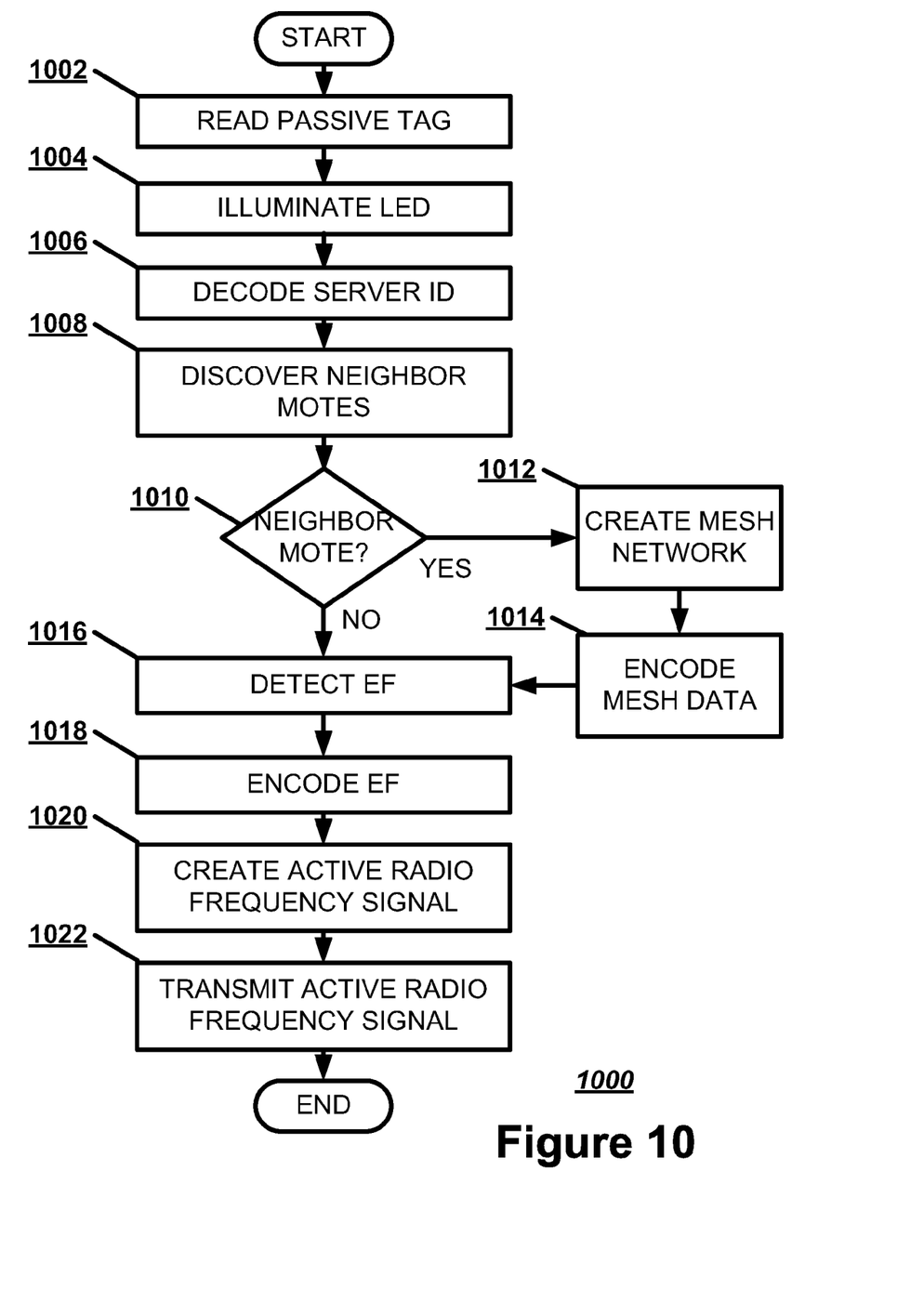
FIG. 10 illustrates, in a flowchart, one embodiment of a method of identifying a server in transit.

FIG. 10 illustrates, in a flowchart, one embodiment of a method 1000 of identifying a server 302 in transit with a snap-on wireless mote 702. The RF ANT 902 may read at close range a passive RFID tag 304 attached to a server 302 (Block 1002). The snap-on wireless mote 900 may illuminate a status LED 912 (Block 1004). The microcontroller 906 may decode the server ID captured by the RF ANT 902 (Block 1006). The microcontroller 906 may execute a discovery protocol with the radio 910 to find any neighbor snap-on wireless motes 804 in the same zone as the server 302 (Block 1008). If a neighbor snap-on wireless mote 804 is present (Block 1010), the microcontroller 906 may execute a mesh network protocol regarding the neighbor snap-on wireless mote 804 to retrieve the server IDs for the neighbor servers 802 (Block 1012). The microcontroller 906 may encode the collected mesh node data into a mesh node signal (Block 1014). The sensor 914 may detect any EF data (Block 1016). The microcontroller 906 may encode the EF data into an EF signal (Block 1018). The microcontroller 906 may create an active radio frequency signal to represent the server 302, incorporating the server ID, the EF signal, and the mesh node signal, if present (Block 1020). The radio 910 may transmit the active radio frequency signal to a PIN 160 (Block 1022). The PIN 160 may append a zone ID or a room ID to the active radio frequency signal before passing it on to the tracking infrastructure manager 170.

Figure 11:
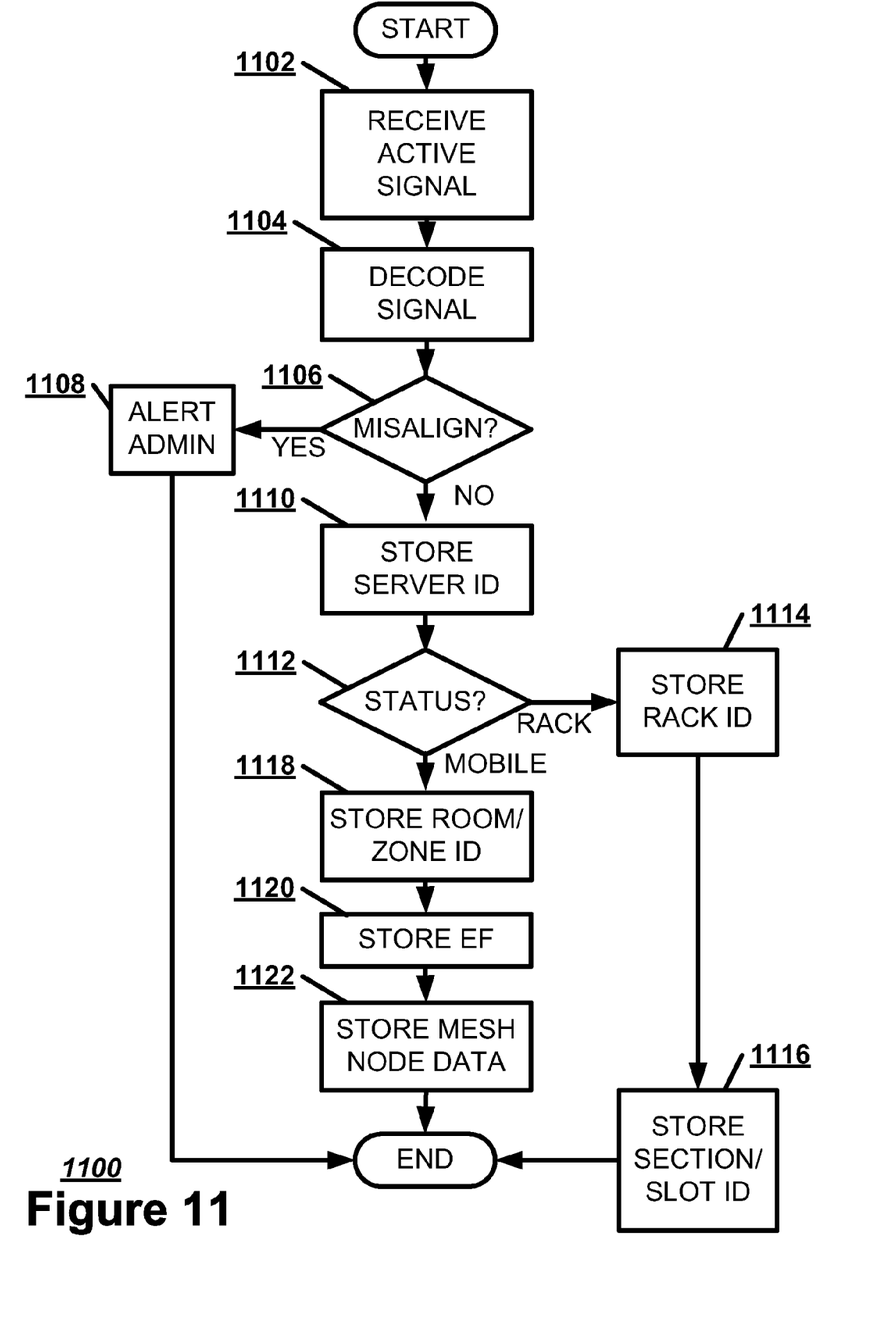
FIG. 11 illustrates, in a flowchart, one embodiment of a method for tracking a server with the tracking infrastructure.

FIG. 11 illustrates, in a flowchart, one embodiment of a method 1100 for tracking a server with the tracking infrastructure. The PIN 160 may receive an active radio frequency signal (Block 1102). The tracking infrastructure manager 170 may decode the active radio frequency signal (Block 1104). If the active radio frequency signal indicates a server misalignment (Block 1106), the tracking infrastructure manager 170 may alert an administrator (Block 1108). The active radio frequency may indicate a server misalignment by replacing the server ID with an invalid signal. The alert may include both the rack ID and the slot ID or section ID of the misaligned server. Otherwise, the tracking infrastructure manager 170 may store the server ID decoded from the active radio frequency signal (Block 1110). The active radio frequency signal may have a status indicating whether the server 302 generating the signal is on the server rack 112 or if the server 302 is mobile. If the status is on the server rack 112 (Block 1112), the tracking infrastructure manager 170 may store the rack ID in a tracking infrastructure database (Block 1114). The tracking infrastructure manager 170 may store either a section ID or a slot ID for the server 302 (Block 1116). If the status is mobile (Block 1112), the tracking infrastructure manager 170 may store a room ID or a zone ID for the server 302 (Block 1118). The tracking infrastructure manager 170 may store any EF for the server 302 (Block 1120). Alternatively, the tracking infrastructure manager 170 may compare the EF data in the active radio frequency signal to a set of thresholds to determine whether an administrator needs to be alerted that a critical condition is potentially damaging the server 302. The tracking infrastructure manager 170 may store any mesh node data (Block 1122).

Figure 12A:
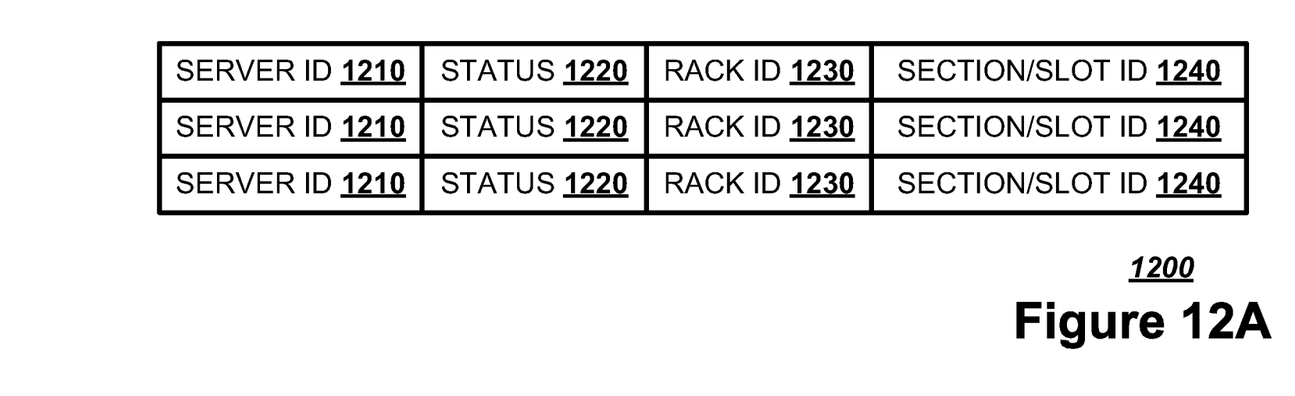
FIG. 12a-b illustrate, in block diagrams, embodiments of a data structure for storing the tracking information.

FIG. 12a illustrates, in a block diagram, an installed server record 1200. The installed server record 1200 may have a server ID 1210 representing the server 302, a status 1220 indicating that the server 302 is installed, a rack ID 1230 indicating the server rack 112 in which the server 302 is installed, and a section ID 1240 identifying the rack section of the server 302 or a slot ID 1240 identifying the rack slot 402 holding the server 302. A misaligned server may have an invalid signal in place of a server ID 1210.

Figure 12B:
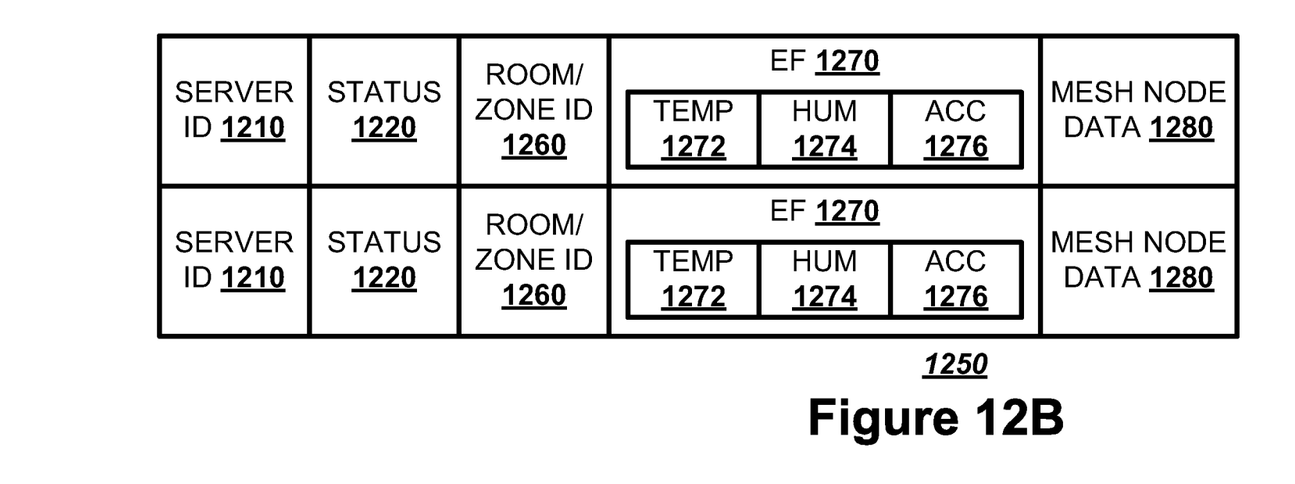

FIG. 12b illustrates, in a block diagram, a mobile server record 1250. The mobile server record 1250 may have a server ID 1210 representing the server 302, a status 1220 indicating that the server 302 is mobile, and a room ID 1260 indicating the room holding the server 302 or a zone ID 1260 indicating the zone containing the server 302. Additionally, the mobile server record 1250 may have one or more EF records 1270, such as a temperature record 1272, a humidity record 1274, or an acceleration record 1276. The mobile server record 1250 may also store a set of mesh node data 1280 detailing any acquired information regarding any neighbor servers 802.

Although the subject matter has been described in language specific to structural features and/or methodological acts, it is to be understood that the subject matter in the appended claims is not necessarily limited to the specific features or acts described above. Rather, the specific features and acts described above are disclosed as example forms for implementing the claims.

Embodiments within the scope of the present invention may also include non-transitory computer-readable storage media for carrying or having computer-executable instructions or data structures stored thereon. Such non-transitory computer-readable storage media may be any available media that can be accessed by a general purpose or special purpose computer. By way of example, and not limitation, such non-transitory computer-readable storage media can comprise RAM, ROM, EEPROM, CD-ROM or other optical disk storage, magnetic disk storage or other magnetic storage devices, or any other medium which can be used to carry or store desired program code means in the form of computer-executable instructions or data structures. Combinations of the above should also be included within the scope of the non-transitory computer-readable storage media.

Embodiments may also be practiced in distributed computing environments where tasks are performed by local and remote processing devices that are linked (either by hardwired links, wireless links, or by a combination thereof) through a communications network.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, objects, components, and data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Although the above description may contain specific details, they should not be construed as limiting the claims in any way. Other configurations of the described embodiments are part of the scope of the disclosure. For example, the principles of the disclosure may be applied to each individual user where each user may individually deploy such a system. This enables each user to utilize the benefits of the disclosure even if any one of a large number of possible applications do not use the functionality described herein. Multiple instances of electronic devices each may process the content in various possible ways. Implementations are not necessarily in one system used by all end users. Accordingly, the appended claims and their legal equivalents should only define the invention, rather than any specific examples given.

We claim:

1. A machine-implemented method for identifying a server, comprising:
    reading at close range a passive radio frequency identification tag attached to the server;
    creating an active radio frequency signal representing the server; and
    transmitting the active radio frequency signal to a position infrastructure node that receives transmissions from at least a mobile snap-on wireless mote as part of a mobile server detection system.

2. The method of claim 1, wherein the passive radio frequency identification tag is attached to the server by a spring loaded hinge near a rack face of the server.

3. The method of claim 1, further comprising:
    reading the passive radio frequency identification tag with a rack mounted reader strip of a rack mounted server identifier; and
    transmitting the active radio frequency signal with a rack mounted antenna of the rack mounted server identifier.

4. The method of claim 3, further comprising:
    identifying a rack slot holding the server in the active radio frequency signal.

5. The method of claim 4, further comprising:
    indicating with a light emitting diode whether the passive radio frequency identification tag is being read properly in the rack slot.

6. The method of claim 3, further comprising:
    identifying a rack section of the server in the active radio frequency signal.

7. The method of claim 3, further comprising:
    identifying with a radio frequency identification reader a rack slot holding a misaligned server in the active radio frequency signal.

8. The method of claim 1, further comprising:
    reading the passive radio frequency identification tag with a radio frequency antenna of the mobile snap-on wireless mote; and
    transmitting the active radio frequency signal with a radio of the snap-on wireless mote.

9. The method of claim 8, further comprising:
    discovering a neighbor snap-on wireless mote with the snap-on wireless mote.

10. The method of claim 8, further comprising:
    detecting an environmental factor of the server with the snap-on wireless mote.

11. A mobile snap-on wireless mote, comprising:
    a snap-on connector that attaches the mobile snap-on wireless mote to a server outside a server rack;
    a radio frequency antenna that reads at close range a passive radio frequency identification tag attached to the server; and
    a radio that transmits an active radio frequency signal representing the server to a position infrastructure node as part of a mobile server detection system.

12. The mobile snap-on wireless mote of claim 11, wherein the radio discovers a neighbor snap-on wireless mote.

13. The mobile snap-on wireless mote of claim 12, further comprising:
    a microcontroller to execute a mesh network protocol regarding the neighbor snap-on wireless mote.

14. The mobile snap-on wireless mote of claim 11, further comprising:
    a sensor to detect an environmental factor of the server.

15. The mobile snap-on wireless mote of claim 14, wherein the environmental factor is at least one of temperature, humidity, and acceleration.

16. A tracking infrastructure manager, comprising:
    a communication interface that receives an active radio frequency signal from a position infrastructure node; and
    a processor that decodes the active radio frequency signal indicating a mobile snap-on wireless mote attached to read a passive radio frequency identifier of a server outside a server rack;
    a database interface that stores a location for the mobile server in a tracking infrastructure database.

17. The tracking infrastructure manager of claim 16, wherein the database interface stores the location for the server as at least one of a room identifier and a zone identifier.

18. The tracking infrastructure manager of claim 16, wherein the database interface stores an environmental factor for the server.

19. The tracking infrastructure manager of claim 16, wherein the communication interface alerts an administrator that a critical condition is potentially damaging the server.

20. The tracking infrastructure manager of claim 16, wherein the database interface stores a mesh node data set for the server.

* * * * *